United States Patent
Hung et al.

(10) Patent No.: US 10,783,963 B1
(45) Date of Patent: Sep. 22, 2020

(54) IN-MEMORY COMPUTATION DEVICE WITH INTER-PAGE AND INTRA-PAGE DATA CIRCUITS

(71) Applicant: MACRONIX INTERNATIONAL CO., LTD., Hsinchu (TW)

(72) Inventors: Chun-Hsiung Hung, Hsinchu (TW); Shang-Chi Yang, Changhua (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/297,504

(22) Filed: Mar. 8, 2019

(51) Int. Cl.
*G11C 13/00* (2006.01)
*G06N 3/063* (2006.01)
*G06N 3/08* (2006.01)

(52) U.S. Cl.
CPC ........ *G11C 13/004* (2013.01); *G11C 13/0026* (2013.01); *G11C 13/0028* (2013.01); *G06N 3/0635* (2013.01); *G06N 3/08* (2013.01)

(58) Field of Classification Search
None
See application file for complete search history.

(56) References Cited

U.S. PATENT DOCUMENTS

| | | | |
|---|---|---|---|
| 4,219,829 A | 8/1980 | Dorda et al. |
| 4,987,090 A | 1/1991 | Hsu et al. |
| 5,586,073 A | 12/1996 | Hiura et al. |
| 6,107,882 A | 8/2000 | Gabara et al. |
| 6,313,486 B1 | 11/2001 | Kencke et al. |
| 6,829,598 B2 | 12/2004 | Milev |
| 6,906,940 B1 | 6/2005 | Lue |
| 6,960,499 B2 | 11/2005 | Nandakumar et al. |
| 7,368,358 B2 | 5/2008 | Ouyang et al. |
| 7,747,668 B2 | 6/2010 | Nomura et al. |
| 8,203,187 B2 | 6/2012 | Lung et al. |
| 8,275,728 B2 | 9/2012 | Pino |

(Continued)

FOREIGN PATENT DOCUMENTS

| CN | 1998012 B | 11/2010 |
|---|---|---|
| CN | 105718994 A | 6/2016 |

(Continued)

OTHER PUBLICATIONS

EP Extended Search Report from 18155279.5-1203 dated Aug. 30, 2018, 8 pages.

(Continued)

*Primary Examiner* — James G Norman
(74) *Attorney, Agent, or Firm* — Haynes Beffel & Wolfeld LLP

(57) ABSTRACT

An in-memory computation device is described that comprises a memory with a plurality of blocks B(n) of cells, where n ranges from 0 to N−1. A page output circuit PO(n) and page input circuit PI(n) are operatively coupled to block B(n) in the plurality of sets. A data bus system for providing an external source of input data and a destination for output data is provided. Data circuits are configurable connect page input circuit PI(n) to one or more of page output circuit PO(n), page output circuit PO(n−1), and the data bus system to source the page input data in a sensing cycle. This configuration can be done between each sensing cycle, or in longer intervals, in order to support a variety of neural network configurations and operations.

20 Claims, 9 Drawing Sheets

(56) References Cited

U.S. PATENT DOCUMENTS

| | | | |
|---|---|---|---|
| 8,432,719 | B2 | 4/2013 | Lue |
| 8,589,320 | B2 | 11/2013 | Breitwisch et al. |
| 8,630,114 | B2 | 1/2014 | Lue |
| 8,860,124 | B2 | 10/2014 | Lue et al. |
| 9,064,903 | B2 | 6/2015 | Mitchell et al. |
| 9,379,129 | B1 | 6/2016 | Lue et al. |
| 9,430,735 | B1 | 8/2016 | Vali et al. |
| 9,431,099 | B2 | 8/2016 | Lee et al. |
| 9,524,980 | B2 | 12/2016 | Lue |
| 9,536,969 | B2 | 1/2017 | Yang et al. |
| 9,589,982 | B1 | 3/2017 | Cheng et al. |
| 9,698,156 | B2 | 7/2017 | Lue |
| 9,698,185 | B2 | 7/2017 | Chen et al. |
| 9,710,747 | B2 | 7/2017 | Kang et al. |
| 9,754,953 | B2 | 9/2017 | Tang et al. |
| 10,242,737 | B1 * | 3/2019 | Lin ................... H01L 27/2463 |
| 2003/0122181 | A1 | 7/2003 | Wu |
| 2005/0287793 | A1 | 12/2005 | Blanchet et al. |
| 2010/0182828 | A1 | 7/2010 | Shima et al. |
| 2010/0202208 | A1 | 8/2010 | Endo et al. |
| 2011/0063915 | A1 | 3/2011 | Tanaka et al. |
| 2011/0106742 | A1 | 5/2011 | Pino |
| 2011/0286258 | A1 | 11/2011 | Chen et al. |
| 2011/0297912 | A1 | 12/2011 | Samachisa et al. |
| 2012/0044742 | A1 | 2/2012 | Narayanan |
| 2012/0235111 | A1 | 9/2012 | Osano et al. |
| 2013/0075684 | A1 | 3/2013 | Kinoshita et al. |
| 2014/0063949 | A1 | 3/2014 | Tokiwa |
| 2014/0119127 | A1 | 5/2014 | Lung et al. |
| 2014/0149773 | A1 | 5/2014 | Huang et al. |
| 2014/0268996 | A1 | 9/2014 | Park |
| 2015/0008500 | A1 | 1/2015 | Fukumoto et al. |
| 2016/0141337 | A1 | 5/2016 | Shimabukuro et al. |
| 2016/0181315 | A1 | 6/2016 | Lee et al. |
| 2016/0247579 | A1 | 8/2016 | Ueda et al. |
| 2016/0308114 | A1 | 10/2016 | Kim et al. |
| 2016/0336064 | A1 | 11/2016 | Seo et al. |
| 2016/0358661 | A1 | 12/2016 | Vali et al. |
| 2017/0092370 | A1 | 3/2017 | Harari |
| 2017/0148517 | A1 | 5/2017 | Harari |
| 2017/0169887 | A1 | 6/2017 | Widjaja |
| 2017/0270405 | A1 | 9/2017 | Kurokawa |
| 2017/0309634 | A1 | 10/2017 | Noguchi et al. |
| 2017/0316833 | A1 | 11/2017 | Ihm et al. |
| 2017/0317096 | A1 | 11/2017 | Shin et al. |
| 2018/0121790 | A1 | 5/2018 | Kim et al. |
| 2019/0148393 | A1 | 5/2019 | Lue |
| 2019/0220249 | A1 | 7/2019 | Lee et al. |
| 2019/0244662 | A1 | 8/2019 | Lee et al. |
| 2019/0286419 | A1 | 9/2019 | Lin et al. |
| 2020/0026993 | A1 | 1/2020 | Otsuka |

FOREIGN PATENT DOCUMENTS

| | | |
|---|---|---|
| CN | 105789139 A | 7/2016 |
| CN | 106530210 A | 3/2017 |
| EP | 2048709 A2 | 4/2009 |
| TW | 201523838 A | 6/2015 |
| TW | 201618284 A | 5/2016 |
| TW | 201639206 A | 11/2016 |
| TW | 201732824 A | 9/2017 |
| TW | 201802800 A | 1/2018 |
| WO | 2012009179 A1 | 1/2012 |
| WO | 2012015450 A1 | 2/2012 |
| WO | 2016060617 A1 | 4/2016 |
| WO | 2017091338 A1 | 6/2017 |

OTHER PUBLICATIONS

EP Extended Search Report from EP18158099.4 dated Sep. 19, 2018, 8 pages.

Jang et al., "Vertical cell array using TCAT(Terabit Cell Array Transistor) technology for ultra high density NAND flash memory," 2009 Symposium on VLSI Technology, Honolulu, HI, Jun. 16-18, 2009, pp. 192-193.

Kim et al. "Multi-Layered Vertical Gate NAND Flash Overcoming Stacking Limit for Terabit Density Storage," 2009 Symposium on VLSI Technology Digest of Papers, Jun. 16-18, 2009, 2 pages.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technolgy Digest of Technical Papers, pp. 186-187. (cited in parent).

Ohzone et al., "Ion-Implanted Thin Polycrystalline-Silicon High-Value Resistors for High-Density Poly-Load Static RAM Applications," IEEE Trans. on Electron Devices, vol. ED-32, No. 9, Sep. 1985, 8 pages.

Sakai et al., "A Buried Giga-Ohm Resistor (BGR) Load Static RAM Cell," IEEE Symp. on VLSI Technology, Digest of Papers, Sep. 10-12, 1984, 2 pages.

Schuller et al., "Neuromorphic Computing: From Materials to Systems Architecture," US Dept. of Energy, Oct. 29-30, 2015, Gaithersburg, MD, 40 pages.

Seo et al., "A Novel 3-D Vertical FG NAND Flash Memory Cell Arrays Using the Separated Sidewall Control Gate (S-SCG) for Highly Reliable MLC Operation," 2011 3rd IEEE International Memory Workshop (IMW), May 22-25, 2011, 4 pages.

Soudry, et al. "Hebbian learning rules with memristors," Center for Communication and Information Technologies CCIT Report #840, Sep. 1, 2013, 16 pages.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Office Action in U.S. Appl. No. 15/887,166 dated Jan. 30, 2019, 18 pages.

U.S. Appl. No. 15/873,369, filed Jan. 17, 2018, entitled "Sum-of-Products Accelerator Array," Lee et al., 52 pages.

U.S. Appl. No. 15/887,166, filed Feb. 2, 2018, entitled "Sum-of-Products Array for Neuromorphic Computing System," Lee et al., 49 pages.

U.S. Appl. No. 15/895,369, filed Feb. 13, 2018, entitled "Device Structure for Neuromorphic Computing System," Lin et al., 34 pages.

U.S. Appl. No. 15/922,359 filed Mar. 15, 2018, entitled "Voltage Sensing Type of Matrix Multiplication Method for Neuromorphic Computing System, " Lin et al., 40 pages.

U.S. Appl. No. 16/037,281, filed Jul. 17, 2018, 87 pages.

Whang, SungJin et al. "Novel 3-dimensional Dual Control-gate with Surrounding Floating-gate (DC-SF) NAND flash cell for 1Tb file storage application," 2010 IEEE Int'l Electron Devices Meeting (IEDM), Dec. 6-8, 2010, 4 pages.

Lue et al., "A Novel 3D AND-type NVM Architecture Capable of High-density, Low-power In-Memory Sum-of-Product Computation for Artificial Intelligence Application," IEEE VLSI, Jun. 18-22, 2018, 2 pages.

U.S. Office Action in U.S. Appl. No. 15/922,359 dated Jun. 24, 2019, 8 pages.

U.S. Office Action in related case U.S. Appl. No. 15/873,369 dated May 9, 2019, 8 pages.

Chen et al., "Eyeriss: An Energy-Efficient reconfigurable accelerator for deep convolutional neural networks," IEEE ISSCC, Jan. 31-Feb. 4, 2016, 3 pages.

EP Extended Search Report from EP19193290.4 dated Feb. 14, 2020, 10 pages.

Gonugondla et al., "Energy-Efficient Deep In-memory Architecture for NAND Flash Memories," IEEE International Symposium on Circuits and Systems (ISCAS), May 27-30, 2018, 5 pages.

Jung et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

TW Office Action from TW Application No. 10820980430, dated Oct. 16, 2019, 6 pages (with English Translation).

(56) References Cited

OTHER PUBLICATIONS

U.S. Office Action in U.S. Appl. No. 15/873,369 dated Dec. 4, 2019, 5 pages.
U.S. Office Action in U.S. Appl. No. 15/887,166 dated Jul. 10, 2019, 18 pages.
U.S. Office Action in U.S. Appl. No. 15/922,359 dated Oct. 11, 2019, 7 pages.
U.S. Office Action in U.S. Appl. No. 16/233,414 dated Oct. 31, 2019, 22 pages.
U.S. Office Action in related case U.S. Appl. No. 16/037,281 dated Dec. 19, 2019, 9 pages.
Wang et al., "Three-Dimensional NAND Flash for Vector-Matrix Multiplication," IEEE Trans. on Very Large Scale Integration Systems (VLSI), vol. 27, No. 4, Apr. 2019, 4 pages.

\* cited by examiner

IN-MEMORY COMPUTATION DEVICE WITH INTER-PAGE AND INTRA-PAGE DATA CIRCUITS

BACKGROUND

Field

The present invention relates to in-memory computing devices, and more particularly, to in-memory computing devices supporting efficient data sharing among multiple computational stages.

Description of Related Art

A neural network is an information processing paradigm that is inspired by the way biological nervous systems process information. With the availability of large training datasets and sophisticated learning algorithms, neural networks have facilitated major advances in numerous domains such as computer vision, speech recognition, and natural language processing.

The basic unit of computation in a neural network is often referred to as a neuron. A neuron receives inputs from other neurons, or from an external source, performs an operation, and provides an output. FIG. 1 illustrates an example neural network 100. The neural network 100 contains multiple neurons arranged in layers, which can be considered to be an example of a computational stage including many parallel operations. The neural network 100 includes an input layer 102 of input neurons (i.e., neurons that provide the input data), three hidden layers 106, 108 and 110 of hidden neurons (i.e., neurons that perform computations and transfer information from the input neurons to the output neurons), and an output layer 104 of output neurons (i.e., neurons that provide the output data). Neurons in adjacent layers have synaptic layers of connections between them. For example, the synaptic layer 112 connects neurons in the input layer 102 and the hidden layer 106, the synaptic layer 114 connects neurons in the hidden layers 106 and 108, the synaptic layer 116 connects neurons in the hidden layers 108 and 110, and the synaptic layer 118 connects the neurons in the hidden layer 110 and the output layer 104. All these connections have weights associated with them. For example, the neurons 122, 124 and 126 in the hidden layer 106 are connected to a neuron 128 in the hidden layer 108 by connections with weights $w_1$ 132, $w_2$ 134 and $w_3$ 136, respectively. The output for the neuron 128 in the hidden layer 108 can be calculated as a function of the inputs ($x_1$, $x_2$, and $x_3$) from the neurons 122, 124 and 126 in the hidden layer 106 and the weights $w_1$ 132, $w_2$ 134 and $w_3$ 136 in the connections. The function can be expressed as follows:

$$f(x_i) = \sum_{i=1}^{M} w_i x_i$$

In the sum-of-products expression above, each product term is a product of a variable input $x_1$ and a weight $w_1$. The weight $w_1$ can vary among the terms, corresponding for example to coefficients of the variable inputs $x_1$. Similarly, outputs from the other neurons in the hidden layer can also be calculated. The outputs of the two neurons in the hidden layer 110 act as inputs to the output neuron in the output layer 104.

Neural networks are used to learn patterns that best represent a large set of data. The hidden layers closer to the input layer in general learn high level generic patterns, and the hidden layers closer to the output layer in general learn more data-specific patterns. Training is a phase in which a neural network learns from training data. During training, the connections in the synaptic layers are assigned weights based on the results of the training session. Inference is a stage in which a trained neural network is used to infer/predict using input data and to produce output data based on the prediction.

In-memory computing is an approach in which memory cells, organized in an in-memory computing device, can be used for both data processing and memory storage. A neural network can be implemented using an in-memory computing device for a number of synaptic layers. The weights for the sum-of-products function can be stored in memory cells of the in-memory computing device. The sum-of-products function can be realized as a circuit operation in the in-memory computing device in which the electrical characteristics of the memory cells of the array effectuate the function.

An engineering issue associated with neural networks relates to movement of data among the synaptic layers. In some embodiments, there can be thousands of neurons in each layer, and the routing of the outputs of the neurons to the inputs of other neurons can be a time consuming aspect of the execution of the neural network.

It is desirable to provide in-memory neural network technology that supports efficient movement of data among the computational components of the system.

SUMMARY

An in-memory computation device is described that comprises a memory configured in a plurality of blocks useable for in-memory computations. Blocks B(n), n going from 0 to N−1, in the plurality of blocks have corresponding page input circuits PI(n) and page output circuits PO(n) that are operatively coupled to sets of bit lines in the blocks. For example, each block B(n) can include a set S(n) of bit lines coupled to its corresponding page output circuit and to its corresponding page input circuit. The device includes in some embodiments a data bus system for providing an external source of input data and a destination for output data. Data circuits are configurable to connect page input circuit PI(n) to one or more of page output circuit PO(n), page output circuit PO(n−1), and the data bus system to source input data for a sensing cycle. This configuration can be done between each sensing cycle, or in longer intervals, in order to support a variety of neural network configurations and operations.

In a device described herein, a plurality of bit line bias circuits is connected to bit lines in the plurality of blocks. Bit line bias circuit Y(n) in the plurality of bit line bias circuits being operatively coupled to block B(n), and to page input circuit PI(n) in the plurality of page input circuits. The bit line biasing circuit can bias the bit lines in block B(n) in response to input voltages generated by page input circuit PI(n).

Other aspects and advantages of the present invention can be seen on review of the drawings, the detailed description and the claims, which follow.

DETAILED DESCRIPTION

A detailed description of embodiments of the present invention is provided with reference to the FIGS. 2-8.

Figure 1:
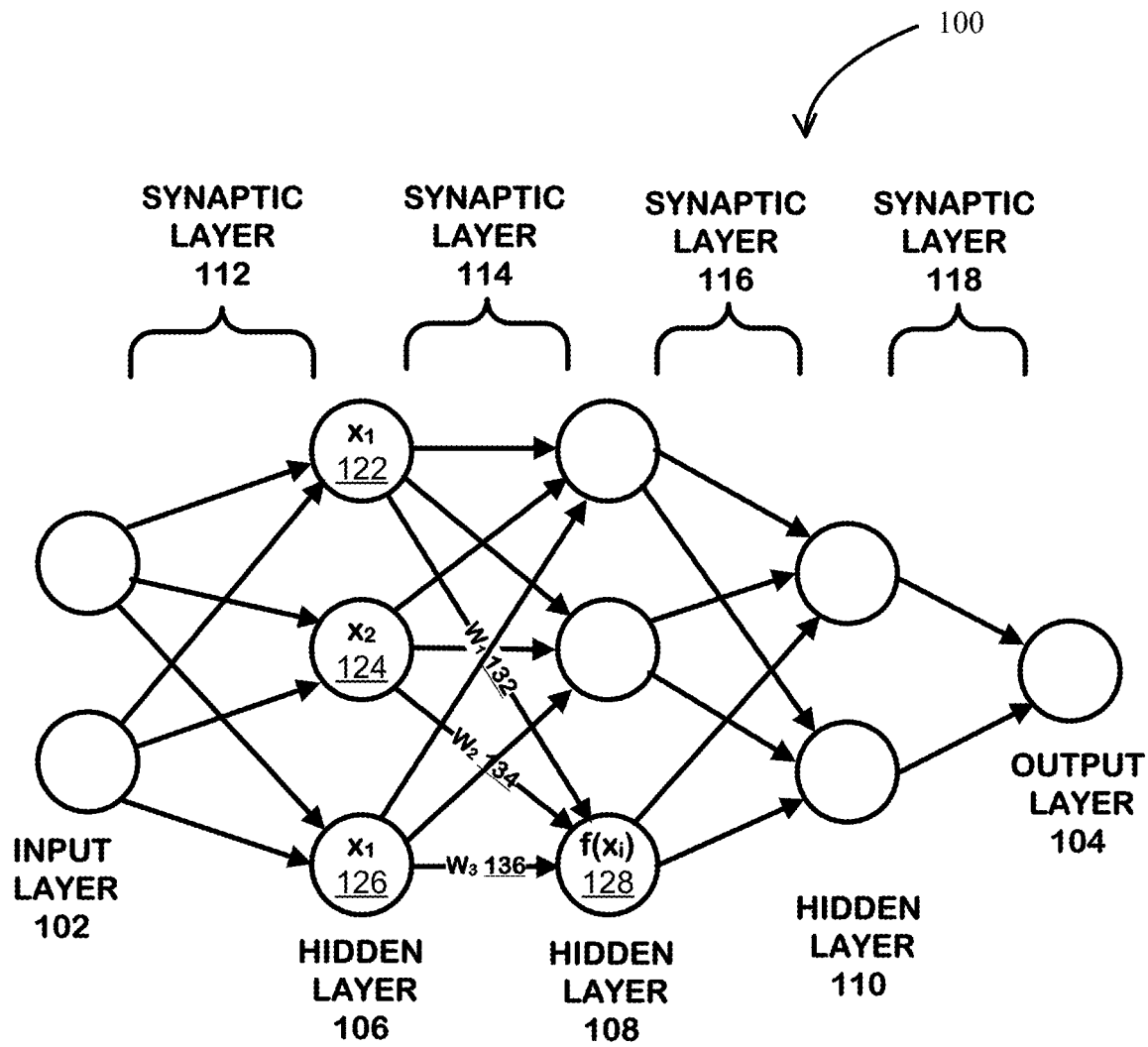
FIG. 1 illustrates an example neural network.
Figure 2:
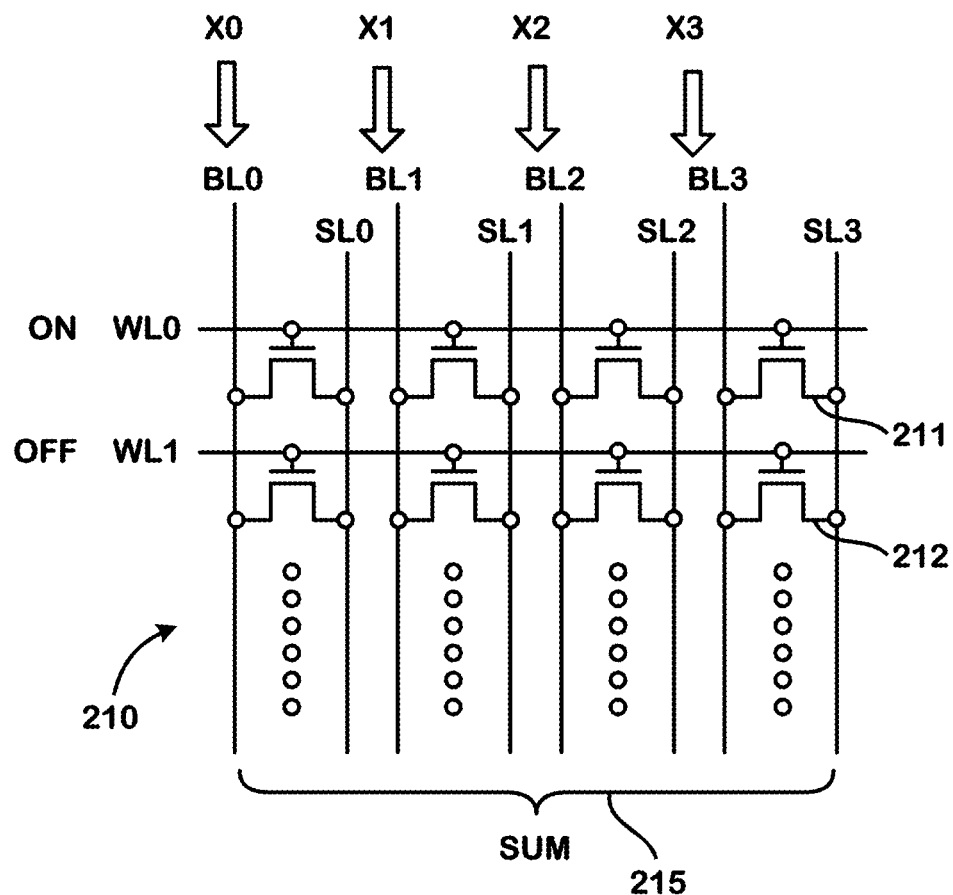
FIG. 2 illustrates a NOR style memory array configured for in-memory computation of a sum-of-products suitable for use in a neural network.

FIG. 2 illustrates a memory array 210 including a plurality of memory cells (e.g. 211, 212) configured in a NOR style. The memory cells in a given column of the array are connected between a bit line and a source line. In the illustrated example, there are columns of memory cells between bit line BL0 and source line SL0, between bit line BL1 and source line SL1, between bit line BL2 and source line SL2, and between bit line BL3 and source line SL3. To execute a sum-of-products operation in-memory, a coefficient vector (a set of coefficients W(i)) is stored in the memory cells in a given row, such as on the row of cells connected to word line WL0. Input data (X0-X3) is applied by biasing the bit lines BL0 to BL3 connecting a bias voltage to the drain side of the memory cells. A row of memory cells is selected by applying a word line signal to a selected word line (e.g. WL0). Unselected word lines are biased in an off condition. Current is generated in the cells in the selected row that is a function of the coefficient W(i) stored in the accessed memory cell, and the input data X(i). The signals generated on the bit lines or source lines in response to the word line signal on the selected word line can be combined (215) to generate the sum-of-products output SUM by sensing a sum of the signals.

The memory cells in the array of FIG. 2 can be nonvolatile memory cells, such as floating gate memory cells or dielectric charge trapping memory cells. Also, programmable resistance memory cells can be utilized, such as phase change memory, metal oxide memory and others. In some embodiments, the memory cells in the array of FIG. 2 can be volatile memory cells. The memory cells in the array of FIG. 2 can store one bit per cell in some examples. In other examples, the memory cells in the array of FIG. 2 can store multiple bits per cell. In yet other examples, the memory cells in the array of FIG. 2 can store analog values.

The NOR style array can be implemented with many bit lines and word lines, storing thousands or millions of bits. The NOR style array of FIG. 2 can be implemented in a three-dimensional configuration, with many two-dimensional arrays stacked in many levels.

In-memory computation circuits as described herein can use memory arrays of other styles in some examples, including for example AND style arrays or NAND style arrays.

Figure 3A:
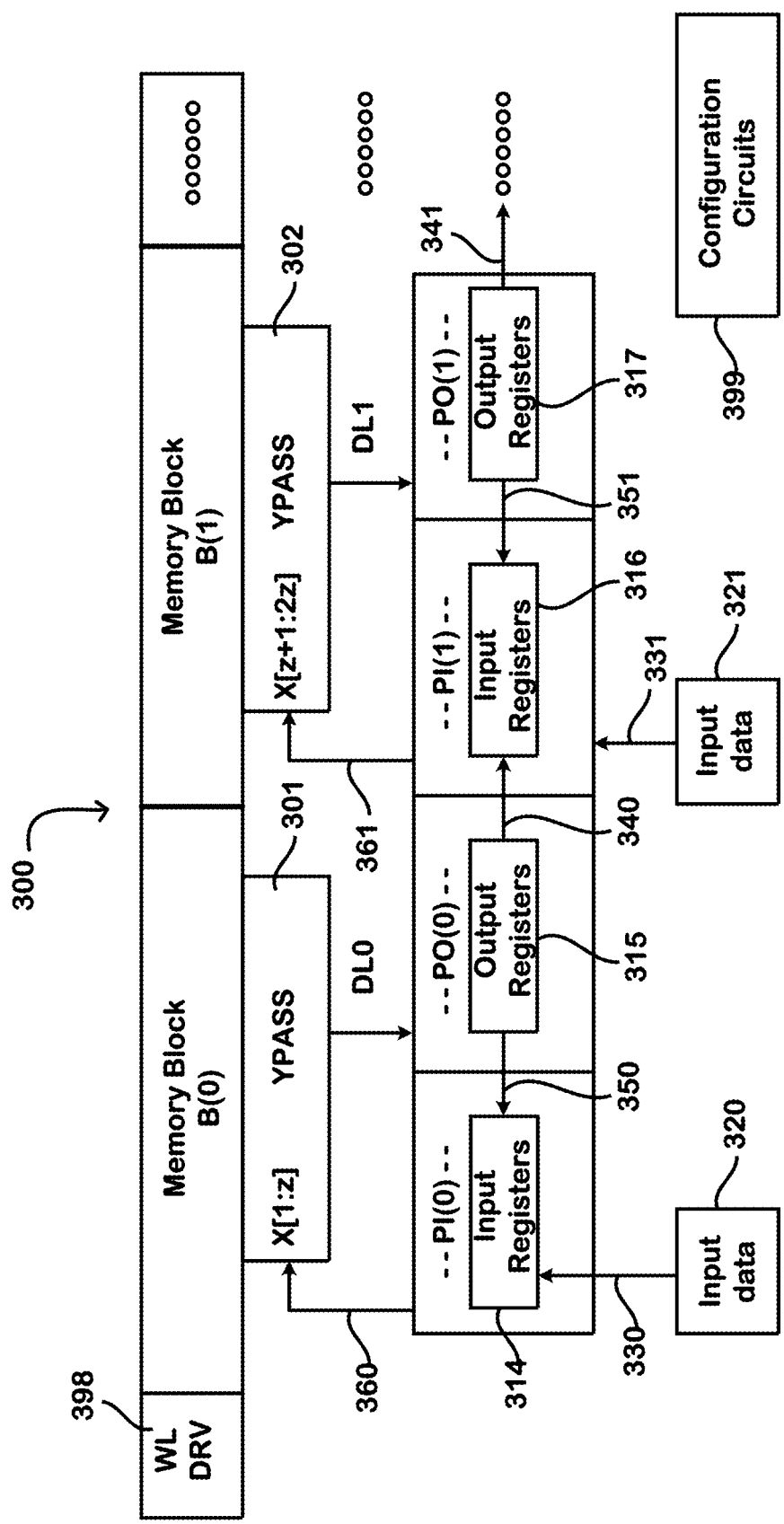
FIG. 3A is a simplified diagram of an in-memory computation device with inter-page and intra-page data circuits.

FIG. 3A is a simplified diagram of an in-memory computation device that includes a memory 300 that comprises an array of memory cells storing coefficients W(i), and including a plurality of word lines and a plurality of bit lines. The memory is configured in a plurality of blocks, B(0), B(1), and so on. Each block includes a plurality of bit lines and a plurality of word lines. The word lines can be shared among more than one block in some embodiments, so that he word lines for more than one block are driven and decoded together, or constitute a shared single word line conductor across more than one block. In other embodiments, the word lines are driven and decoded for individual blocks.

In this example, the blocks B(n) in the plurality of blocks comprise corresponding YPASS circuits 301, 302, which combine the signals on the set S(n) of bit lines in the block into an output signal on a data line DL(n). The memory cells coupled to the bit lines in the set S(n) of bit line store a coefficient vector W(n) represented by the threshold voltages of the memory cells in a row or rows selected by word line signals.

Also, the YPASS circuits include a plurality of bit line bias circuits (not shown in FIG. 3A) connected to the plurality of sets of bit lines. Bit line bias circuit Y(n) in the plurality of bit line bias circuits is operatively coupled to set S(n) of bit lines in the corresponding block B(n), and to page input circuit PI(n) in the plurality of page input circuits. The bit line bias circuit biases the bit lines in set S(n) in response to input voltages generated by page input circuit PI(n). The input signals X[1:z] on line 360 are input voltages in this example, applied to YPASS circuit 301, and X[z+1:2z] on line 361 are applied to YPASS circuit 302, to be applied to the corresponding set of bit lines having "z" members. In general, there can be a large number of blocks including YPASS circuits, each of which includes N sets S(n) of bit lines, where a YPASS circuit in block (n) including set S(n) bit lines receives input signals, X[n*z+1:(n+1)*z)], for n going from 0 to N−1.

In the illustrated embodiment, two blocks, B(0) and B(1), are illustrated. In general, there can be a plurality of blocks B(n), where "n" ranges from 0 to N−1, and N can be any positive integer more than 1. In some embodiments, the number N can be 8 for example, or 16. In other embodiments, N can be in much higher.

The memory 300 can comprise a single two-dimensional array, in which the blocks are arranged side-by-side in sequence. In other embodiments, the memory 300 can comprise a three-dimensional array, including a plurality of stacked two-dimensional arrays. In this case, each two-dimensional array in the stack can comprise one block. Blocks arranged in sequence can reside on sequential levels of the stack. In other arrangements, each two-dimensional array in the stack can comprise more than one block configured as illustrated.

A data bus system, represented by the input data block 320 and the input data block 321, is provided on the device. The data bus system can be used as an input/output interface for data from an external data source, or from other circuitry on the device that generates data for use as the input vectors in some configurations. The input data block 320 and the input data block 321 can comprise, for examples, a data cache memory, a register or a latch coupled to input/output circuitry on the device or other data bus circuits.

The output signals on lines DL0 and DL1 from the YPASS circuits 301, 302 represent an in-memory computation result, combining the signals on the bit lines in the corresponding block B(0) or B(1), that are produced in response to weights stored in memory cells selected by a word line signal on a selected word line in the memory array, and to the input signals X[n*z+1:(n+1)*z)] from lines 360, 361 for the corresponding block. Word line drivers 398 and decoders are included to provide the word line signals on selected word lines. In the simplified example shown in FIG. 3A, YPASS circuits 301, 302 are coupled to corresponding page input circuits PI(0), PI(1) which provide input signals X[n*z+1:(n+1)*z)] on lines 360 and 361, respectively. Also, YPASS circuits 301, 302 are coupled to corresponding page output circuits PO(0), PO(1) to receive in-memory computation result on corresponding data lines DL0 and DL1, respectively.

In this illustration, the page input circuits (PI(0) and PI(1)) include respective input registers 314, 316 which store input data in the form of input vectors VI(n) received as input from data circuits on the device for the corresponding block B(n). The page input circuits can include circuits that convert the input vector VI(n), which have a number of bits equal to a multiple M of the number Z of bit lines in the block, to the input signals. Also, the page output circuits (PO(0) and PO(1)) include respective output registers 315, 317 which store output vectors VO(n) generated in response to an in-memory computation using memory cells in the corresponding block B(n) for output to the data circuits on the device. The output vectors VO(n) can have the same number of bits as the input vectors VI(n), or a different number of bits.

Data circuits on the device are configurable to interconnect the input register for a given page (e.g., PI(1)) singly or in any combination, with sources of input data, including the output register of a previous page (e.g., PO(0)), the output register of the same page (e.g., PO(1) as feedback) and the data bus to source input data for a given sensing cycle. An input vector including the input data applied to the input register in a given sensing cycle can be sourced by a single source, or a combination of multiple sources. The data circuits are configurable to transfer an output vector VO(0) of page output circuit PO(0) as all or part an input vector VI(1) to the next page input circuit PI(1) as represented by the line 340. Also, data circuits are configurable to feed back the output vector VO(0) of the page output circuit PO(0) as all or part of an input vector VI(0) for the page input circuit PI(0), as represented by line 350. In addition, the data circuits are configurable to connect the page input circuit PI(0) to the data bus system including input data block 320 as represented by line 330, to receive all or part of an input vector VI(0) from another source in the bus system.

Likewise, the data circuits on the device are configurable to transfer an output vector VO(1) of page output circuit PO(1) as all or part of an input vector VI(2) for the next page input circuit as represented by the line 341. Also, data circuits are configurable to feedback the output VO(1) of the page output circuit PO(1) as all or part of an input vector VI(1) for the page input circuit PI(1), as represented by line 351. In addition, the data circuits are configurable to connect the page input circuit PI(1) to the data bus system including input data block 321 as represented by line 331, to receive all or part of an input vector VI(1) from an another source on the bus system.

Configuration circuits 399 are included on the device. The circuits 399 include logic, configuration parameters storage, or both. The configuration circuits 399 control the configuration of the data circuits for the routing of input vectors and output vectors among the page input and page output circuits. The configuration of the data circuits can be set dynamically for each sensing cycle as suits the needs of a particular implementation, using timed control signals delivered to switches in the data circuits. Alternatively, the configuration circuit can use volatile or nonvolatile configuration registers to set up the data circuits.

Control circuits, not shown, are coupled to the circuit of FIG. 3A, and include logic to control execution of in-memory computation operations, data circuit configuration operations in coordination with configuration circuits 399, and memory operations like program and erase. The control circuits can comprise command decoders, configuration registers, state machines and timing circuits set up to control the operations. The control circuits can include voltage regulators, charge pumps and other bias circuits to provide appropriate bias voltages in support of the memory operations.

Figure 3B:
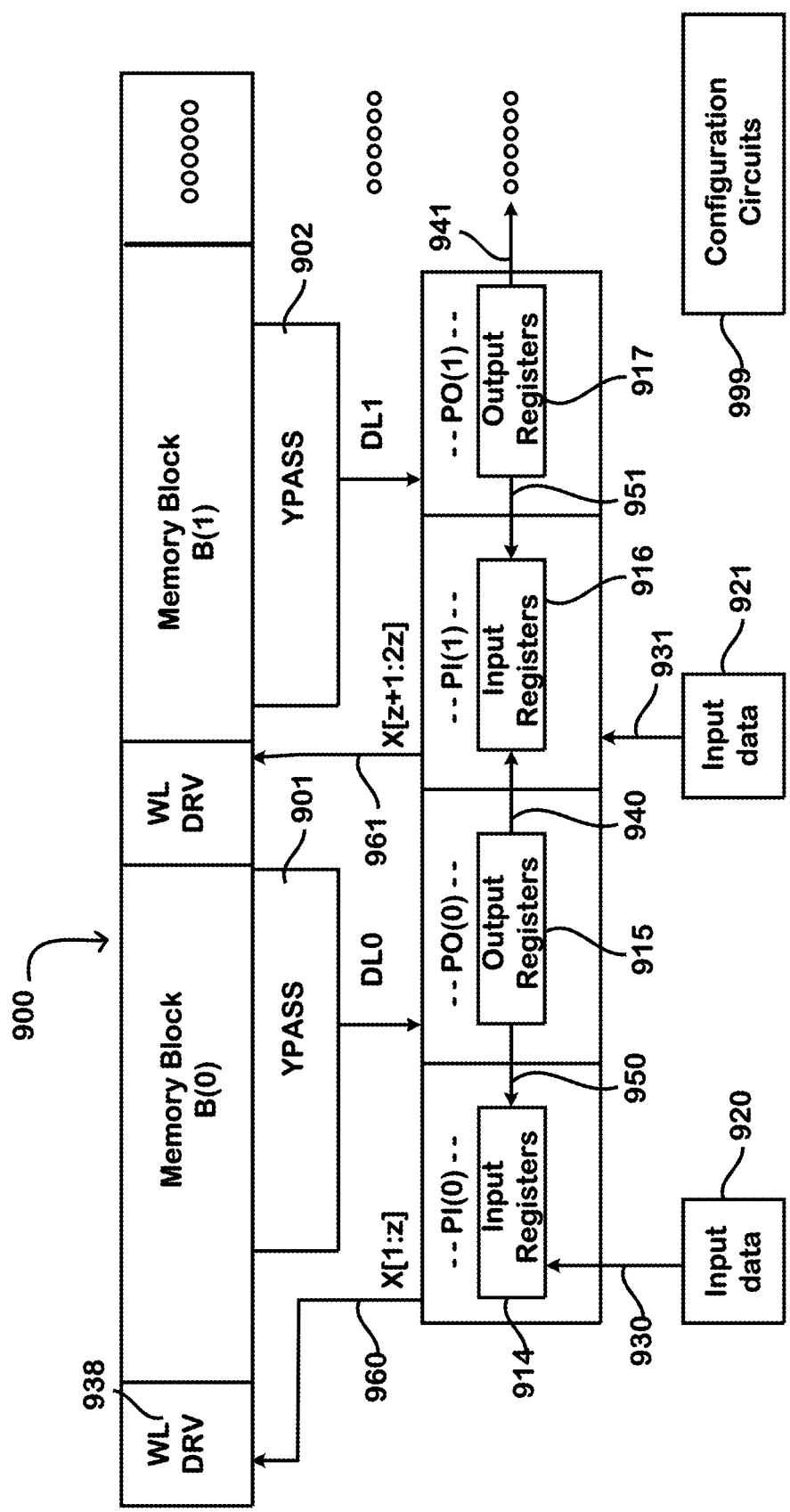
FIG. 3B is a simplified diagram of an alternative in-memory computation device with inter-page and intra-page data circuits.

FIG. 3B is a simplified diagram of an in-memory computation device that includes a memory 900 that comprises an array of memory cells storing coefficients W(i), and including a plurality of word lines and a plurality of bit lines. The memory is configured in a plurality of blocks, B(0), B(1), and so on. Each block includes a plurality of bit lines and a plurality of word lines. The word lines are driven and decoded for individual blocks in this example.

In this example, the blocks B(n) in the plurality of blocks comprise corresponding YPASS circuits 901, 902, which combine the signals on the set S(n) of bit lines in the block into an output signal on a data line DL(n). The memory cells coupled to the bit lines in the set S(n) of bit line store a coefficient vector W(n) represented by the threshold voltages of the memory cells in a row or rows selected by one or more word line signals.

Also, the word line drivers include a plurality of bias circuits (not shown in FIG. 3B) connected to the plurality of sets of word lines. Word line driver WD(n) in the plurality of word line drivers is operatively coupled to a set of word lines in the corresponding block B(n), and to page input circuit PI(n) in the plurality of page input circuits. The word line bias circuit biases the word lines in corresponding block in response to input voltages generated by page input circuit PI(n). The input signals X[1:z] on line 960 are input voltages in this example, applied to a word line driver 938 for block B(0), and X[z+1:2z] on line 961 are applied to a word line driver for block B(1), to be applied to the corresponding set of word lines having "z" members.

In the illustrated embodiment, two blocks, B(0) and B(1), are illustrated. In general, there can be a plurality of blocks B(n), where "n" ranges from 0 to N−1, and N can be any positive integer more than 1. In some embodiments, the number N can be 8 for example, or 16. In other embodiments, N can be in much higher.

The memory 900 can comprise a single two-dimensional array, in which the blocks are arranged side-by-side in sequence. In other embodiments, the memory 900 can comprise a three-dimensional array, including a plurality of stacked two-dimensional arrays. In this case, each two-dimensional array in the stack can comprise one block. Blocks arranged in sequence can reside on sequential levels of the stack. In other arrangements, each two-dimensional array in the stack can comprise more than one block configured as illustrated.

A data bus system, represented by the input data block 920 and the input data block 921, is provided on the device. The data bus system can be used as an input/output interface for data from an external data source, or from other circuitry on the device that generates data for use as the input vectors in some configurations. The input data block 920 and the input data block 921 can comprise, for examples, a data cache memory, a register or a latch coupled to input/output circuitry on the device or other data bus circuits.

The output signals on lines DL0 and DL1 from the YPASS circuits 901, 902 represent an in-memory computation result, combining the signals on the bit lines in the corresponding block B(0) or B(1), that are produced in response to weights stored in memory cells selected by one or more word line signals on a selected word line in the memory array, and to the input signals X[n*z+1:(n+1)*z)] from lines 960, 961 for the corresponding block. In the simplified example shown in FIG. 3B, the word line drivers (e.g. 938) for the blocks B(0) and B(1) are coupled to corresponding page input circuits PI(0), PI(1) which provide input signals X[n*z+1:(n+1)*z)] on lines 960 and 961, respectively. Thus, word line driver WD(n) in the plurality of word line drivers is operatively coupled to block B(n) in the plurality of blocks, and to page input circuit PI(n) in the plurality of page input circuits, and biases the word lines in block B(n) in response to input voltages generated by page input circuit PI(n). Also, YPASS circuits 901, 902 are coupled to corresponding page output circuits PO(0), PO(1) to receive in-memory computation result on corresponding data lines DL0 and DL1, respectively.

In this illustration, the page input circuits (PI(0) and PI(1)) include respective input registers 914, 916 which store input data in the form of input vectors VI(n) received as input from data circuits on the device for the corresponding block B(n). The page input circuits can include circuits that convert the input vector VI(n), which have a number of bits equal to a multiple M of the number Z of bit lines in the block, to the input signals. Also, the page output circuits (PO(0) and PO(1)) include respective output registers 915, 917 which store output vectors VO(n) generated in response to an in-memory computation using memory cells in the corresponding block B(n) for output to the data circuits on the device. The output vectors VO(n) can have the same number of bits as the input vectors VI(n), or a different number of bits.

Data circuits on the device are configurable to interconnect the input register for a given page (e.g., PI(1)) singly or in any combination, with sources of input data, including the output register of a previous page (e.g., PO(0)), the output register of the same page (e.g., PO(1) as feedback) and the data bus to source input data for a given sensing cycle. An input vector including the input data applied to the input register in a given sensing cycle can be sourced by a single source, or a combination of multiple sources. The data circuits are configurable to transfer an output vector VO(0) of page output circuit PO(0) as all or part an input vector VI(1) to the next page input circuit PI(1) as represented by the line 940. Also, data circuits are configurable to feed back the output vector VO(0) of the page output circuit PO(0) as all or part of an input vector VI(0) for the page input circuit PI(0), as represented by line 950. In addition, the data circuits are configurable to connect the page input circuit PI(0) to the data bus system including input data block 920 as represented by line 930, to receive all or part of an input vector VI(0) from another source in the bus system.

Likewise, the data circuits on the device are configurable to transfer an output vector VO(1) of page output circuit PO(1) as all or part of an input vector VI(2) for the next page input circuit as represented by the line 941. Also, data circuits are configurable to feedback the output VO(1) of the page output circuit PO(1) as all or part of an input vector VI(1) for the page input circuit PI(1), as represented by line 951. In addition, the data circuits are configurable to connect the page input circuit PI(1) to the data bus system including input data block 921 as represented by line 931, to receive all or part of an input vector VI(1) from an another source on the bus system.

Configuration circuits 999 are included on the device. The circuits 999 include logic, configuration parameters storage, or both. The configuration circuits 999 control the configuration of the data circuits for the routing of input vectors and output vectors among the page input and page output circuits. The configuration of the data circuits can be set dynamically for each sensing cycle as suits the needs of a particular implementation, using timed control signals delivered to switches in the data circuits. Alternatively, the configuration circuit can use volatile or nonvolatile configuration registers to set up the data circuits.

Control circuits, not shown, are coupled to the circuit of FIG. 3B, and include logic to control execution of in-memory computation operations, data circuit configuration operations in coordination with configuration circuits 999, and memory operations like program and erase. The control circuits can comprise command decoders, configuration registers, state machines and timing circuits set up to control the operations. The control circuits can include voltage regulators, charge pumps and other bias circuits to provide appropriate bias voltages in support of the memory operations.

Figure 4:
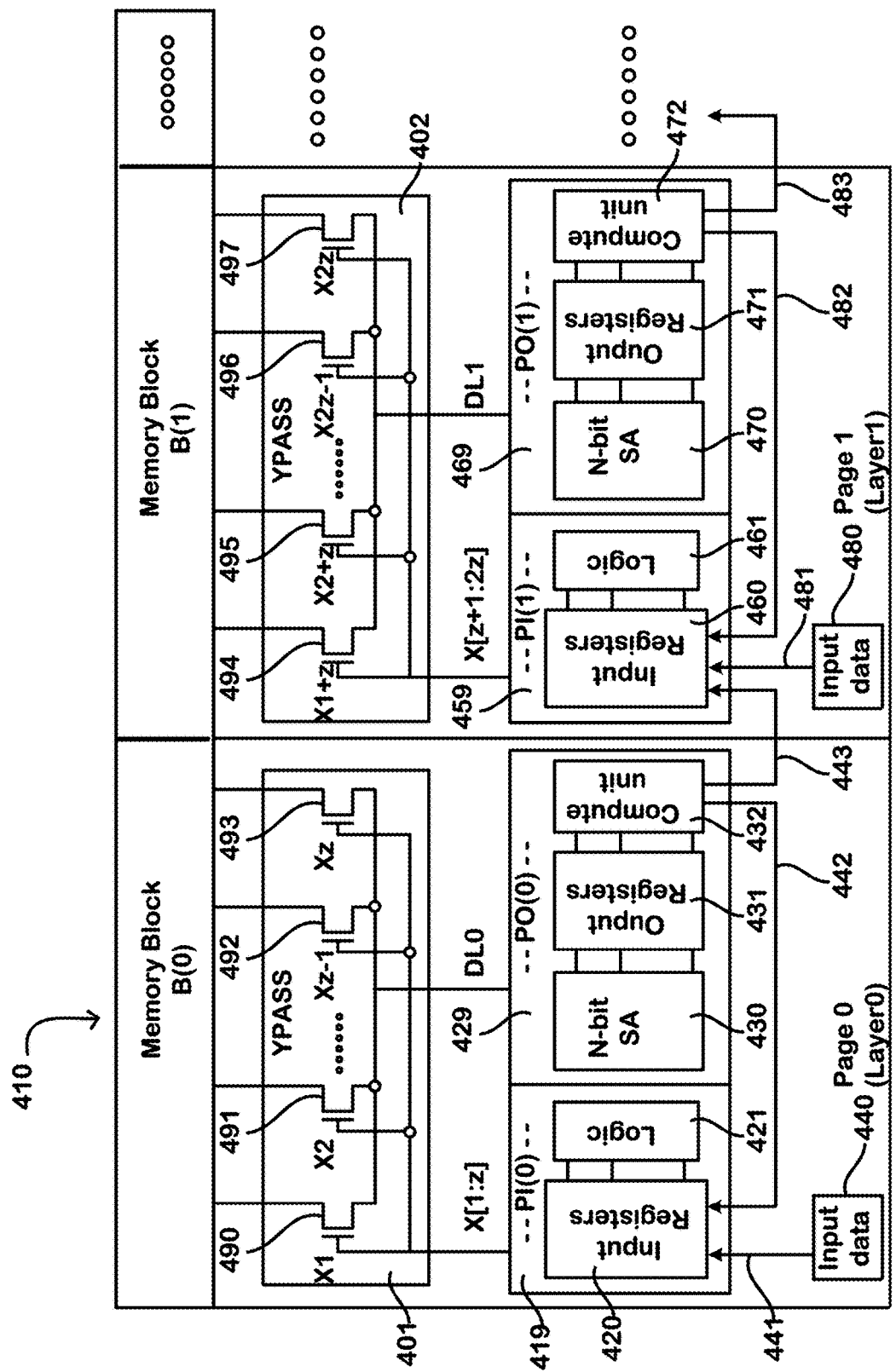
FIG. 4 is a simplified diagram of an in-memory computation device using a NOR style memory array with drain side bias generated in response to input data.

FIG. 4 is a diagram of an in-memory computation device like that of FIG. 3A with information about embodiments of the YPASS circuits 401, 402, the page input circuits PI(0), PI(1) and the page output circuits PO(0), PO(1). The in-memory computation device includes a memory array 410 along with supporting circuitry as mentioned with respect to FIG. 3A. The memory array 410 includes a plurality of blocks B(0), B(1), . . . . A set S(n) of bit lines in each block is coupled to a corresponding YPASS circuit 401, 402.

The YPASS circuit 401 includes a bit line bias circuit. In this embodiment, the bit line bias circuit includes a plurality of clamp transistors 490-493 having one source/drain terminal coupled to a bit line in the block B(0) of the array 410, and another source/drain terminal coupled to a summing node on the data line DL0. The gates of the clamp transistors 490-493 are connected to corresponding input signals in the set of input signals X[1:z] provided by the page input circuit 419.

The YPASS circuit 402 includes a bit line bias circuit. In this embodiment, the bit line bias circuit includes a plurality of clamp transistors 494-497, each having one source/drain terminal coupled to a bit line in the block B(1) of the array 410, and another source/drain terminal coupled to a summing node on the data line DL1. The gates of the clamp transistors 494-497 are connected to corresponding input signals in the set of input signals X[z+1:2z] provided by the page input circuit 459.

In the example shown in FIG. 4, the page input circuit 419 (PI(0)) includes an input register 420 and supporting logic 421, which converts the input vector stored in the input register 420 to the input signals X[1:z] applied to the gates of the clamp transistors. Likewise, the page input circuit 459 (PI(1)) includes an input register 460 and supporting logic 461, which converts the input vector stored in the input register 460 to the input signals X[z+1:2z] applied to the gates of the clamp transistors.

In the example shown in FIG. 4, the page output circuit 429 (PO(0)) includes an N-bit sense amplifier 430, or other type of multilevel sensing circuit or analog-to-digital converter. The output of the sense amplifier 430 is coupled to an output register 431 or other type of register. The output register 431 is connected to a compute unit 432 which can accumulate or otherwise process data stored in the output register 431. In combination, the circuits in the page output circuit 429 convert the signal on the DL0 line into an output vector VO(n) for the computation based on a sum-of-signals generated by memory cells on a selected word line on the block B(n). The sum-of-signals can correspond to a sum-of-products.

Likewise, the page output circuit 469 (PO(1)) includes an N-bit sense amplifier 470, or other type of multilevel sensing circuit or analog-to-digital converter. The output of the sense amplifier 470 is coupled to an output register 471 or other type of register. The output register 471 in this example is connected to a compute unit 472 which can accumulate or otherwise process data stored in the output register 471. In combination, the circuits in the page output circuit 469 convert the signal on the DL 1 line into an output vector VO(n) for the computation based on a sum-of-signals generated by memory cells on a selected word line on the block B(n).

In this example, the cell current in each memory cell on the selected word line coupled to a bit line in the set of bit lines can be represented in one example memory system by the equation:

$$ICELL \approx \mu_n * Cox * (W/L) * (V_{GS} - V_{TH\_CELL}) * V_{DS}$$

$$\approx \mu_n * Cox * (W/L) * (V_{WL} - V_{TH\_CELL}) * (Xi - V_{TH\_ypass})$$

Data circuits on the device are configurable to transfer an output vector VO(0) of page output circuit 429 as an input vector VI(1) for the next page input circuit 459 as represented by the line 443. Also, data circuits are configurable to feedback the output VO(0) of the page output circuit 429 as an input vector VI(0) for the page input circuit 419 as represented by line 442. In addition, the data circuits are configurable to connect the page input circuit 419 to the data bus system 440 as represented by line 441, to receive an input vector VI(0) from an another source on the bus system.

Likewise, data circuits on the device are configurable to transfer an output vector VO(1) of page output circuit 469 as an input vector VI(1) for the next page input circuit as represented by the line 483. Also, data circuits are configurable to feedback the output VO(1) of the page output circuit 469 as an input vector VI(1) for the page input circuit 459 as represented by line 482. In addition, the data circuits are configurable to connect the page input circuit 459 to the data bus system 480 as represented by line 481 to receive an input vector VI(1) from an another source on the bus system.

Figure 5:
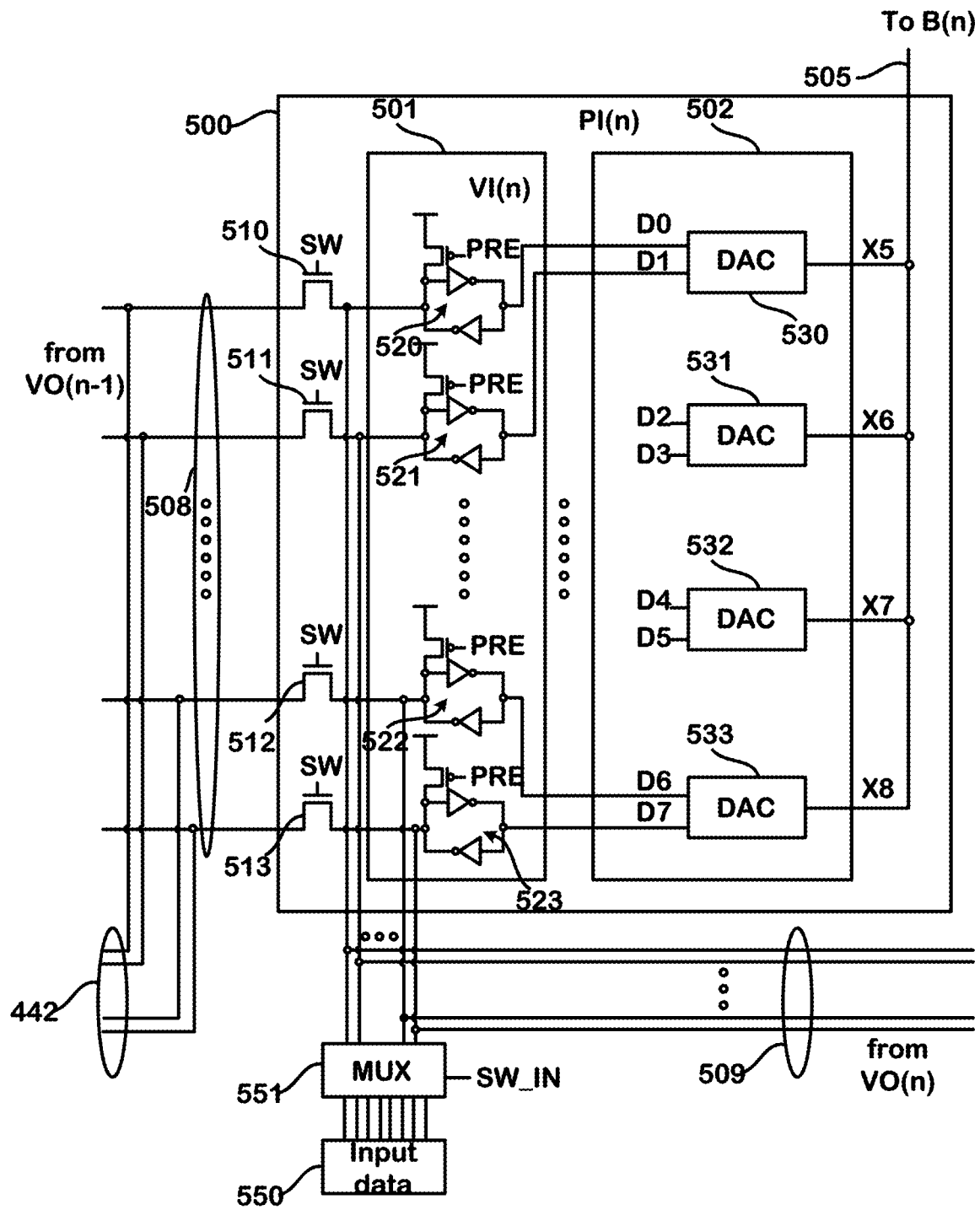
FIG. 5 is a diagram of an embodiment of page input circuitry usable in a device like that of FIG. 4.

FIG. 5 illustrates one example of a page input circuit 500, representing page input circuit PI(n), which is configured to deliver the input signals on bus 505 to the YPASS circuits of the block B(n) in the memory array. Also, portions of the data circuits which are configured to deliver the input vector VI(n) are illustrated.

In this example, the page input circuit 500 includes an input register 501 that comprises a plurality of latches 520-523.

Data circuits include a set of switches 510, 511, 512, 513 operable as a multiplexer in response to the signal SW. The switches 510, 511, 512, 513 connect and disconnect the register 501 to the previous page output circuit which provides output vector VO(n−1) on lines 508 of the data circuits for use as input vector VI(n). Also, the data circuits include a multiplexer 551 and input bus register 550. The multiplexer 551 is responsive to the signal SW_IN to connect and disconnect the input data from the input bus register 550 to deliver an input vector VI(n) to the input register 501. Also the data circuits include a bus 509 which is coupled to a multiplexer (see, MUX 642 in FIG. 6), to receive the output vector VO(n) as feedback from the page output circuit PO(n) coupled to the same block B(n), for use as input vector VI(n). The signal SW and the signal SW_IN are provided by a configuration circuit such as configuration circuits 399 and configuration circuits 999 shown in FIGS. 3A and 3B. The signals SW and SW_IN are provided independently for the page input circuits and page output circuits operatively coupled with each block B(n).

In this example, for an embodiment in which block B(n) includes a number Z of bit lines, the input vector VI(n) includes Z chunks of M bits of data. Input register 501 applies the Z chunks of M bits of input vector VI(n) to conversion circuits 502 that provide the bias voltages X5 to X8 in the Figure to establish the drain level of the selected memory cells in the corresponding block B(n). In this example, the circuits 502 include one M bit digital-to-analog converter 530, 531, 532, 533 for each of the Z chunks in the input vector VI(n) to generate Z analog bias voltages for corresponding bit lines in the block B(n). In this example, M is 2 and Z is 4 with an input vector including 8 bits. In other embodiments, the input vector can include 16 bits, or any number of bits. Also, the number of chunks in the input vector used to generate a bias voltage for one of the corresponding bit lines in the set of bit lines can be determined by the number Z of bit lines in the set.

Figure 6:
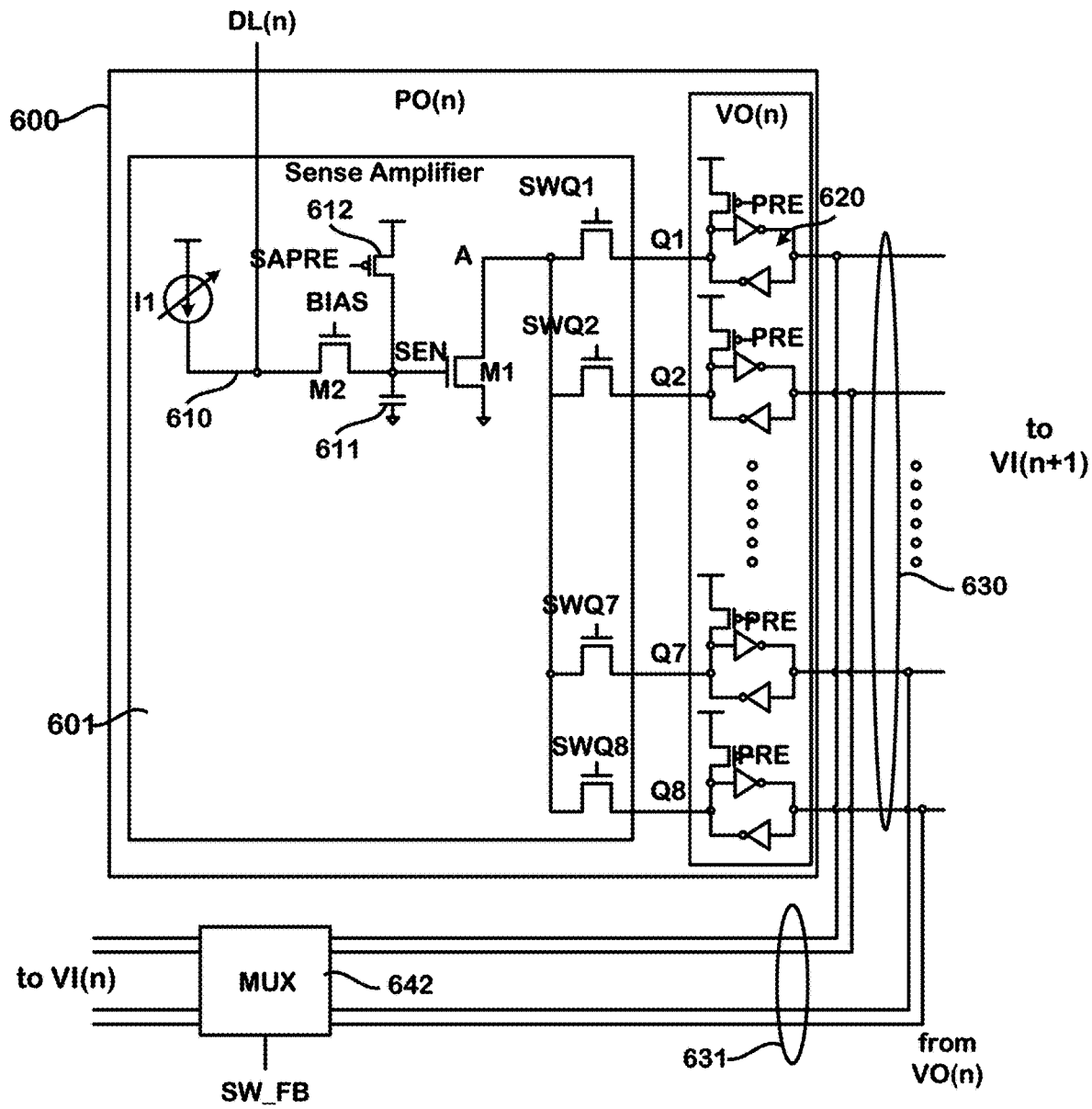
FIG. 6 is a diagram of page output circuitry usable in a device like that of FIG. 4.

FIG. 6 illustrates one example of a page output circuit 600, representing page output circuit PO(n) which is coupled to the block B(n) and to the page input circuit PI(n). The page output circuit 600 is configured to receive the signal on data line DL(n) from the YPASS circuits coupled to the block B(n).

The data line DL(n) is connected to a sense amplifier 601 or other type of sensing circuit or analog-to-digital converter. The sense amplifier 601 in this example includes an adjustable current source I1 which is connected to node 610, which is also connected to data line DL(n). A precharge transistor 612 is coupled to a sensing node SEN. Also a capacitor 611 is coupled to the sensing node SEN. Transistor M2 is connected in series between node 610 and the sensing node SEN. The sensing node SEN is connected to the gate of transistor M1. Transistor M1 is connected between ground and output node A. The output node A is coupled to a set of switches responsive to respective switch signals SWQ1 to SWQ8 in this example for an 8-bit output. The switches apply data signals Q1 to Q8 to corresponding latches in the output register 620. The output register 620 stores the output vector VO(n) for the stage. In operation, the adjustable current source I1 is operated in coordination with the switch signals SWQ1 to SWQ8 to sense a plurality of levels of the signal on DL(n) and store the resulting sensing results in the output register 620.

Data circuits are coupled to the output register 620 for transferring the output vector VO(n) on lines 630 to the page input circuit in the next stage as the input vector VI(n+1), or in feedback on lines 631 as the input vector VI(n) for the page input circuit PI(n) of the same stage through a multiplexer 642, which is controlled by the signal SW_FB. The signal SW_FB is provided by a configuration logic/store such as configuration circuits 399 and configuration circuits 999 shown in FIGS. 3A and 3B, for page input circuits and page output circuits operatively coupled with each block B(n).

Figure 7:
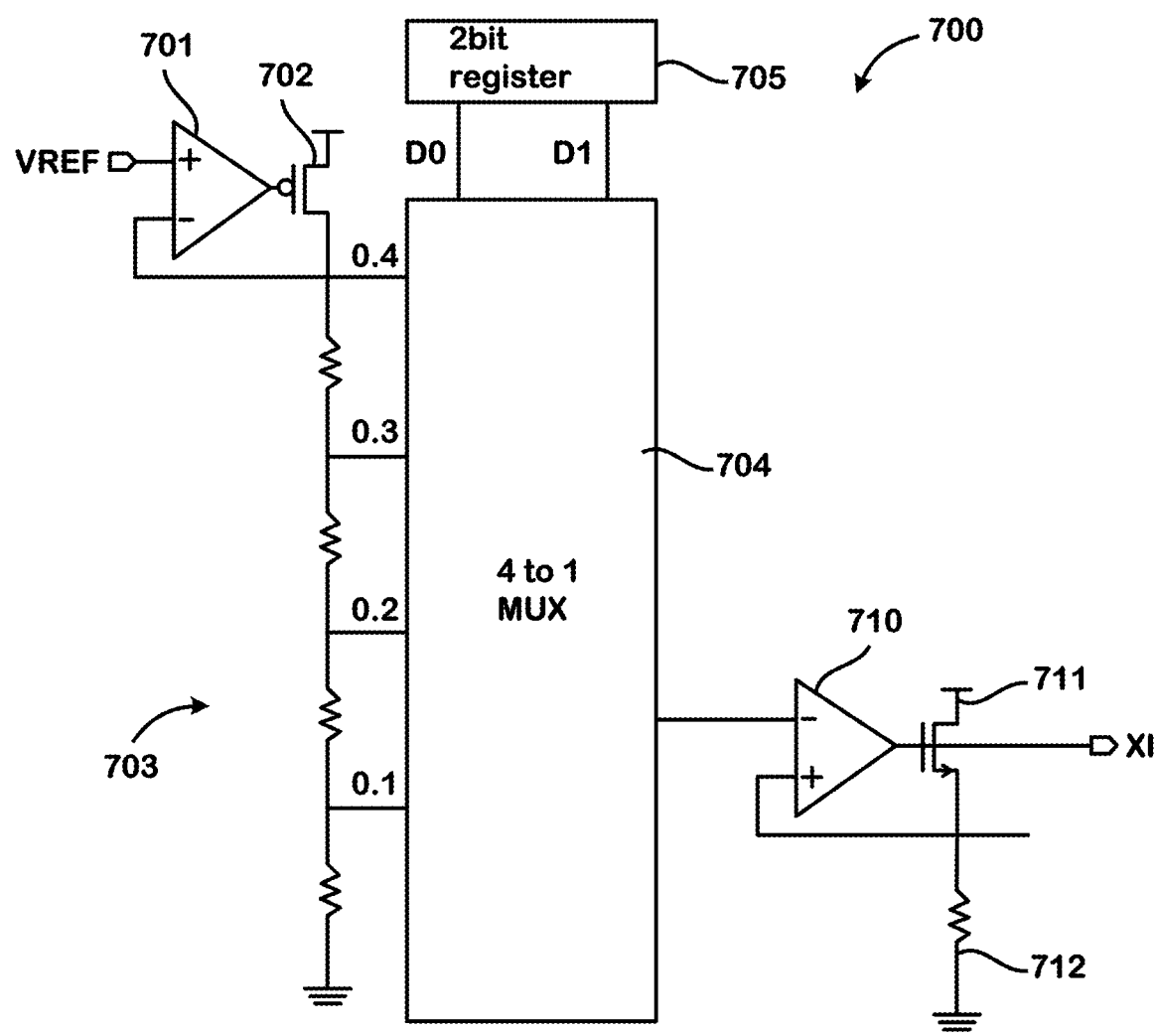
FIG. 7 is a diagram of a digital-to-analog converter usable to generate drain side bias voltages for use in an embodiment like that of FIG. 4.

FIG. 7 illustrates an example digital-to-analog converter 700 which can be utilized in a page input circuit like that shown in FIG. 5. In this example, a chunk of 2 bits D1 and D2 of the input vector register 705 are applied as input to a 4-to-1 multiplexer 704. A reference voltage generating circuit includes an operational amplifier 701 which receives a reference voltage on its "+" input and a feedback signal on its "−" input. The output of the operational amplifier 701 drives the gate of a PMOS transistor 702, controlling current flow through a string of resistors 703. Nodes between the resistors provide output voltage levels O1 to O4 as inputs to the multiplexer 704. In response to the chunk of input data, the reference voltage is applied to the "−" input of the operational amplifier 710, the output of which drives the gate of an NMOS transistor 711 connected between the supply potential and a resistor 712. The resistor is connected to ground. The node on the resistor 712 is applied as feedback to the "+" input of the operational amplifier 710. The operational amplifier 710 in this example is configured in a unity gain mode, and its output is applied as one of the signals X[i] used to bias a bit line in the block B(n).

Figure 8:
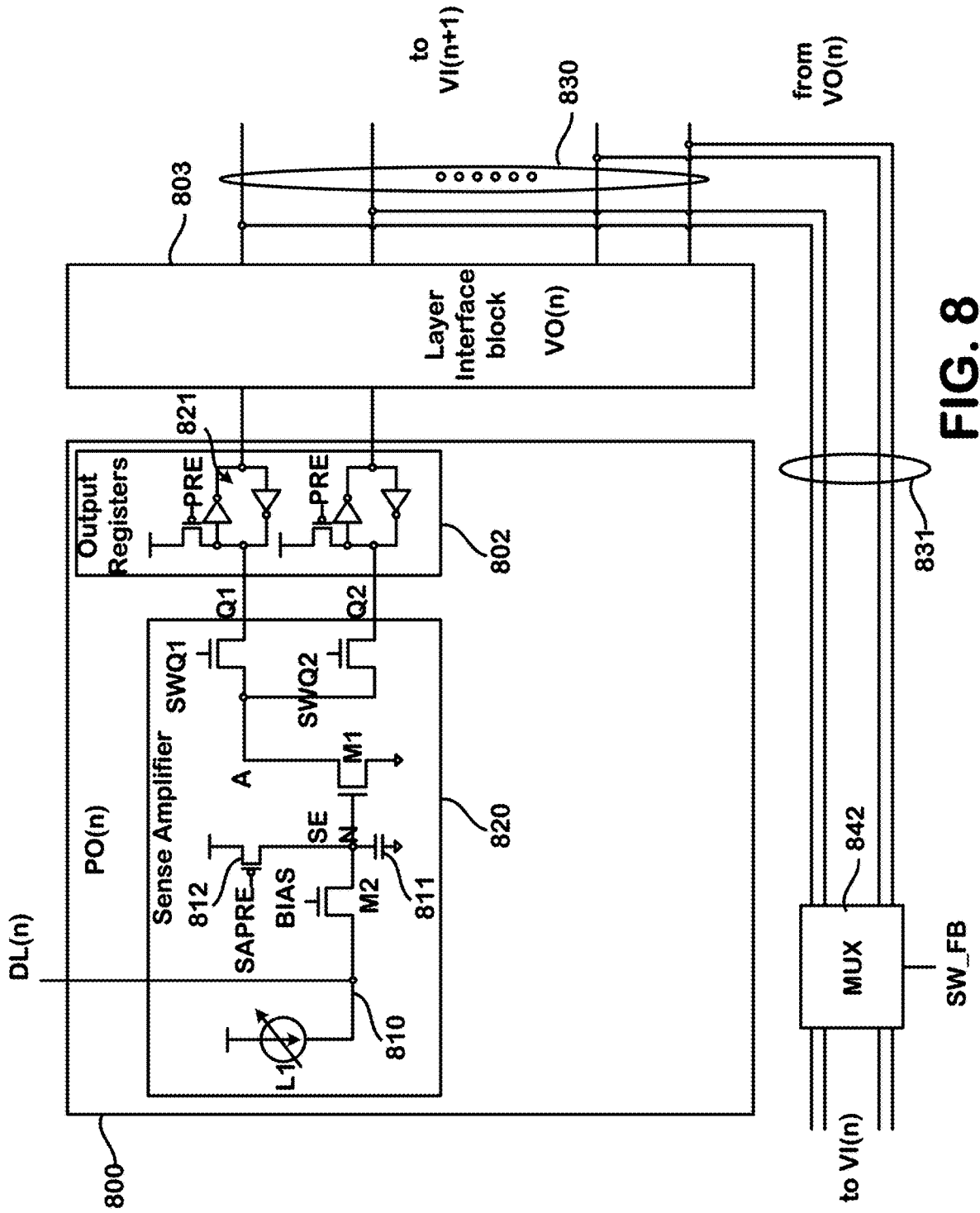
FIG. 8 is a diagram of an alternative embodiment of page output circuitry usable in a device like that of FIG. 4.

FIG. 8 illustrates an alternative embodiment of a page output circuit, representing page output circuit PO(n) which is coupled to the block B(n) and to the page input circuit PI(n). The page output circuit PO(n) is configured to receive the signal on data line DL(n) from the YPASS circuits coupled to the block B(n).

The data line DL(n) is connected to a sense amplifier 820 or other type of sensing circuit or analog-to-digital converter. The sense amplifier 820 in this example includes an adjustable current source I1 which is connected to node 810, which is also connected to data line DL(n). A precharge transistor 812 is coupled to a sensing node SEN. Also a capacitor 811 is coupled to the sensing node SEN. Transistor M2 is connected in series between node 810 and the sensing node SEN. The sensing node SEN is connected to the gate of transistor M1. Transistor M1 is connected between ground and output node A. The output node A is coupled to a set of switches including two members in this example, responsive to respective switch signals SWQ1 to SWQ2 in this example for an 2-bit output. The switches apply data signals Q1 to Q2 to corresponding latches (e.g. 821) in the output register 802. The output register 802 stores a chunk of output vector VO(n) for the stage. In operation, the adjustable current source I1 is operated in coordination with the switch signals SWQ1 to SWQ2 to sense a plurality of levels of the signal on DL(n) and store the resulting sensing results in the output register 802 in each sensing cycle. For example, in each sensing cycle, the sum of the signals from the set of memory cells on one selected word line in the selected set of bit lines can be converted to a 2-bit chunk.

The output of the output register 802 is applied to a layer interface block 803. In this example, the output vector VO(n) can be generated using bit lines on a plurality of layers of a 3D memory. In this example, the interface block 803 provides the chunks of data generated by the sense amplifier 800, which are combined with corresponding chunks generated by interface blocks on other layers of the 3D memory to form an output vector VO(n) having Z chunks of M bits.

In this example, the page output circuit PO(n) is described as comprising chunk-wide portions on a plurality of layers of a 3D memory. The page input circuit PI(n) can be configured in a similar way for connection to a block B(n) coupled to memory cells on the plurality of layers of the 3D memory.

In other embodiments, the interface block 803 can be used to accumulate additional chunks of the output vector in a sequence of sensing cycles using memory cells on a set of word lines in a single layer or single 2D array.

Data circuits are coupled to the interface block 803 for transferring the output vector VO(n) on lines 830 to the page input circuit in the next stage as the input vector VI(n+1), or in feedback on lines 831 as the input vector VI(n) for the page input circuit PI(n) of the same stage through a multiplexer 842, which is controlled by the signal SW_FB. The signal SW_FB is provided by a configuration circuit such as configuration circuits 399 and configuration circuits 999 shown in FIGS. 3A and 3B, for page input circuits and page output circuits operatively coupled with each block B(n).

An in-memory computing structure is described in which a sum-of-products result latched in a page output circuit can feedback as an input vector for the page input circuit in the same block, or pass as an input vector to the page input circuit in the next page. Also, the page input vector in each block can be coupled to a bus system that provides input vectors from other sources on the bus. Thus, the input data can be latched from outside the in-memory computing device, from a feedback loop of the previous state output from the same block, or from the output data in a previous block. With this scheme, a large bandwidth with very little routing capacitance can be achieved. Connection between two blocks can be very short, so that the previous layer or previous page output can be delivered to the next layer, or next block, fast and with low power. The structure can be applied to artificial intelligence processors use for both training and inference steps in deep learning.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An in-memory computation device, comprising:
   a memory including a plurality of blocks B(n), where n ranges from 0 to N−1;
   a plurality of page output circuits PO(n), where n ranges from 0 to N−1, connected to the memory;
   a plurality of page input circuits PI(n), where n ranges from 0 to N−1, connected to the memory and responsive to a page input data to apply a bias to the memory in a sensing cycle; the plurality of page output circuits, the plurality of page input circuits and the plurality of blocks being operatively coupled, so that a page output circuit PO(n) in the plurality of page output circuits and a page input circuit PI(n) in the plurality of page input circuits being operatively coupled to a block B(n) in the plurality of blocks, where n ranges from 0 to N−1;
   a data bus system; and
   data circuits configurable connect the page input circuit PI(n) to one or more of the page output circuit PO(n), the page output circuit PO(n−1), and the data bus system to select a source for the page input data in the sensing cycle.

2. The device of claim 1, including word line drivers coupled to the plurality of blocks in the memory to apply signals on word lines in the blocks, and wherein the page output circuit PO(n) in the plurality of page output circuits includes circuits that generate an output indicating a sumof-signals on a set of bit lines in block B(n), responsive to a signal on a selected word line.

3. The device of claim 2, wherein the page input circuit PI(n) includes bias circuitry responsive to the input data for biasing bit lines in the block B(n), wherein the signals on the bit lines represent a product of the input data and thresholds of memory cells coupled to the selected word line.

4. The device of claim 1, wherein the page input circuit PI(n) includes bias circuitry responsive to the input data for biasing bit lines in the block B(n).

5. The device of claim 1, wherein the page input circuit PI(n) includes an input register connected to the data circuits, to store an input vector VI(n) including the page input data, and circuits to generate bias signals for bit lines in the block B(n) in response to the input vector VI(n).

6. The device of claim 5, wherein the block B(n) includes a number Z of bit lines, the input vector VI(n) includes Z chunks of M bits, and the page input circuit PI(n) includes digital-to-analog conversion circuits to convert chunks of M bits in the input vector VI(n) to Z analog bias voltages for corresponding bit lines in the block B(n).

7. The device of claim 6, wherein the memory cells in block B(n) on a selected word line store coefficient vector W(n), and the signals on the bit lines in the block B(n) represent a product of chunks in the input vector VI(n) and coefficients in the coefficient vector W(n) for the selected word line.

8. The device of claim 1, wherein the page input circuit PI(n) includes an input register connected to the data circuits, to store an input vector VI(n) including the page input data, and circuits to generate bias signals for bit lines in the block B(n) in response to the input vector VI(n), and page output circuit PO(n) in the plurality of page output circuits generates an output vector VO(n).

9. The device of claim 8, wherein the input vector VI(n) includes Z chunks of M bits, and the page output circuit PO(n) in the plurality of page output circuits includes sensing circuits to generate an output including one or more chunks of M bits indicating a sum-of-signals on the bit lines in block B(n) in response to a word line signal on a selected word line, and an output register to store all or part of output vector VO(n) including the Z chunks of M bits.

10. The device of claim 1, wherein the data circuits transfer all or part of output vector VO(n), including Z chunks of M bits as an input vector VI(n+1) to a page input circuit PI(n+1).

11. The device of claim 1, wherein the memory comprises nonvolatile memory cells.

12. The device of claim 11, wherein the nonvolatile memory cells are charge trapping memory cells.

13. The device of claim 1, including word line drivers coupled to the plurality of blocks in the memory to apply signals on word lines in the blocks, and wherein the page output circuit PO(n) in the plurality of page output circuits includes circuits that generate an output indicating a sum-of-signals on one or more bit lines in block B(n), responsive to a signal or signals on one or more selected word lines; and wherein page input circuit PI(n) includes bias circuitry responsive to the input data for biasing word lines in the block B(n), wherein the signals on the bit lines represent a product of the input data and thresholds of memory cells coupled to the one or more selected word lines.

14. An in-memory computation device, comprising:
a memory including a plurality of blocks B(n), where n ranges from 0 to N−1;
a plurality of page output circuits connected to the memory, a page output circuit PO(n) in the plurality of page output circuits generating a page output vector VO(n), and being operatively coupled to a block B(n) in the plurality of blocks;
a plurality of page input circuits connected to the memory, a page input circuit PI(n) in the plurality of page input circuits receiving a page input vector VI(n), and generating input voltages in response to the page input vector VI(n), and being operatively coupled to the block B(n);
a plurality of bit line bias circuits connected to the plurality of blocks, a bit line bias circuit Y(n) in the plurality of bit line bias circuits being operatively coupled to the block B(n) in the plurality of blocks, and to the page input circuit PI(n) in the plurality of page input circuits, and biasing the bit lines in the block B(n) in response to input voltages generated by the page input circuit PI(n);
a data bus system; and
data circuits configurable connect the page input circuit PI(n) to one or more of the page output circuit PO(n), a page output circuit PO(n−1), and the data bus system to select a source for the page input vector VI(n) in a sensing cycle.

15. The device of claim 14, including word line drivers coupled to a plurality of word lines in the memory to apply signals on selected word lines in the plurality of blocks, and wherein the page output circuit PO(n) in the plurality of page output circuits includes circuits that generate page output vector VO(n) indicating a sum-of-signals on the bit lines in block B(n), responsive to a signal on a selected word line.

16. The device of claim 15, wherein the signals on the bit lines in the block B(n) represent a product of the page input vector VI(n) and thresholds of memory cells coupled to the selected word line.

17. The device of claim 16, wherein the memory comprises nonvolatile memory cells.

18. The device of claim 17, wherein the bit line bias circuit Y(n) in the plurality of bit line bias circuits comprises a bit line clamp transistor having agate terminal connected to receive corresponding input voltages generated by the page input circuit PI(n).

19. The device of claim 14, wherein the page input vector VI(n) includes a plurality of multi-bit chunks of data, each chunk in the plurality corresponding to one bit line in the block B(n).

20. An in-memory computation device, comprising:
a memory including a plurality of blocks B(n), where n ranges from 0 to N−1;
a plurality of page output circuits connected to the memory, a page output circuit PO(n) in the plurality of page output circuits generating a page output vector VO(n), and being operatively coupled to a block B(n) in the plurality of blocks;
a plurality of page input circuits connected to the memory, a page input circuit PI(n) in the plurality of page input circuits receiving a page input vector VI(n), and generating input voltages in response to the page input vector VI(n), and being operatively coupled to the block B(n);

a plurality of word line drivers connected to the plurality of blocks, a word line driver WD(n) in the plurality of word line drivers being operatively coupled to the block B(n) in the plurality of blocks, and to the page input circuit PI(n) in the plurality of page input circuits, and biasing the word lines in block B(n) in response to input voltages generated by the page input circuit PI(n);

a data bus system; and data circuits configurable connect page input circuit PI(n) to one or more of page output circuit PO(n), page output circuit PO(n−1), and the data bus system to select a source for the page input vector VI(n) in a sensing cycle.

* * * * *

UNITED STATES PATENT AND TRADEMARK OFFICE
CERTIFICATE OF CORRECTION

PATENT NO. : 10,783,963 B1
APPLICATION NO. : 16/297504
DATED : September 22, 2020
INVENTOR(S) : Chun-Hsiung Hung et al.

Page 1 of 1

It is certified that error appears in the above-identified patent and that said Letters Patent is hereby corrected as shown below:

In the Claims

Claim 18, Column 14, Line 46, delete the word "agate", and replace it with -- a gate --.

Signed and Sealed this
Second Day of March, 2021

Drew Hirshfeld
*Performing the Functions and Duties of the*
*Under Secretary of Commerce for Intellectual Property and*
*Director of the United States Patent and Trademark Office*